United States Patent
Roohparvar

(10) Patent No.: US 7,345,922 B2
(45) Date of Patent: *Mar. 18, 2008

(54) POSITION BASED ERASE VERIFICATION LEVELS IN A FLASH MEMORY DEVICE

(75) Inventor: Frankie F. Roohparvar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/416,582

(22) Filed: May 3, 2006

(65) Prior Publication Data

US 2006/0193177 A1    Aug. 31, 2006

Related U.S. Application Data

(63) Continuation of application No. 11/113,833, filed on Apr. 25, 2005, now Pat. No. 7,082,059, which is a continuation of application No. 10/431,749, filed on May 8, 2003, now Pat. No. 6,891,758.

(51) Int. Cl.
   *G11C 11/34* (2006.01)
(52) U.S. Cl. .................. 365/185.22; 365/185.29; 365/185.3; 365/185.24; 365/185.18
(58) Field of Classification Search .......... 365/185.22, 365/185.29, 185.3, 185.24
See application file for complete search history.

(56) References Cited

U.S. PATENT DOCUMENTS

| | | | |
|---|---|---|---|
| 4,949,305 A | 8/1990 | Toyama et al. | |
| 5,010,520 A | 4/1991 | Minagawa et al. | |
| 5,163,021 A | 11/1992 | Mehrotra et al. | |
| 5,448,712 A | 9/1995 | Kynett et al. | |
| 5,548,549 A | 8/1996 | Ong | |
| 5,663,909 A | 9/1997 | Sim | |
| 5,798,966 A | 8/1998 | Keeney | |
| 5,886,927 A | 3/1999 | Takeuchi | |
| 5,991,517 A | 11/1999 | Harari et al. | |
| 6,421,277 B2 * | 7/2002 | Tsunesada | 365/185.3 |
| 6,452,840 B1 | 9/2002 | Sunkavalli et al. | |
| 6,744,670 B2 * | 6/2004 | Tamada et al. | 365/185.19 |
| 6,891,758 B2 * | 5/2005 | Roohparvar | 365/185.22 |
| 7,082,059 B2 * | 7/2006 | Roohparvar | 365/185.22 |

* cited by examiner

*Primary Examiner*—Viet Q. Nguyen

(74) *Attorney, Agent, or Firm*—Leffert, Jay & Polglaze P.A.

(57) ABSTRACT

The location of a cell to be erase verified is determined. The erase verification threshold voltage is then set. The threshold voltage is changed in response to the cell's location with respect to array ground. A cell in the middle of a row of cells between array grounds is verified to a lower voltage than a cell that is closer to an array ground.

19 Claims, 4 Drawing Sheets

US 7,345,922 B2

POSITION BASED ERASE VERIFICATION LEVELS IN A FLASH MEMORY DEVICE

RELATED APPLICATIONS

This application is a continuation of U.S. patent application Ser. No. 11/113,833, filed Apr. 25, 2005 now U.S. Pat. No. 7,082,059 and titled, POSITION BASED ERASE VERIFICATION LEVELS IN A FLASH MEMORY DEVICE, which is a continuation of U.S. patent application Ser. No. 10/431,749, filed May 8, 2003, now U.S. Pat. No. 6,891,758, issued May 10, 2005, and titled, POSITION BASED ERASE VERIFICATION LEVELS IN A FLASH MEMORY DEVICE, each of which is commonly assigned and incorporated by reference herein in their entirety.

TECHNICAL FIELD OF THE INVENTION

The present invention relates generally to memory devices and in particular the present invention relates to read and verification thresholds in a flash memory device.

BACKGROUND OF THE INVENTION

Flash memory devices have developed into a popular source of non-volatile memory for a wide range of electronic applications. Flash memory devices typically use a one-transistor memory cell that allows for high memory densities, high reliability, and low power consumption. Common uses for flash memory include portable computers, personal digital assistants (PDAs), digital cameras, and cellular telephones. Program code, system data such as a basic input/output system (BIOS), and other firmware can typically be stored in flash memory devices. Most electronic devices are designed with a single flash memory device.

One type of synchronous flash memory device is a flash memory device that has a synchronous dynamic random access memory (SDRAM) interface. This enables the synchronous flash device to operate at much higher speeds than a typical flash memory. One type of synchronous flash memory device does not read one bit at a time, as in typical flash memories. These synchronous flash memories read an entire row of memory at once. In general, a synchronous flash memory allows reading and writing data in synchronization with an external clock.

FIG. 1 illustrates a diagram of a typical prior art row of a synchronous flash memory array. The row is comprised of number of cells 110-113 that store the charge. Typically, each row is made up of 4000 cells with 16 cells between array grounds. Each cell 110-113 is comprised of a drain connection 103 that is coupled to a bit line and a source connection 105 that is coupled to the memory array ground through a source line. A gate connection 107 is coupled to a word line, such as WL0, that controls access to that particular row of cells.

Each of the cells 110-113 has a drain-to-source resistance that is inherent in the cell's composition. This resistance may be in the 2 k to 10 k Ohm range depending on the topology of the cell. When one cell is read, the other cells in the row are also activated by the word line. Current flowing through the other cells in the row goes through the same path to array ground, effectively creating a number of parallel resistances on either side of the desired cell, if the cell is towards the middle of the row. The cell's effective source resistance varies depending on the location of the cell relative to the array ground.

When the cell is verified, the same resistance is present. Therefore, a cell that is furthest from the array ground tends to be erased further since there is a higher potential on its source as the cell current causes the local source voltage to rise. This voltage increase causes the cell $V_{gs}$ and current to decrease.

A specific current level is expected for cell verification. Since the current is reduced, more erase pulses are sent in order to get the same current level as the cells that are closer to array ground. Therefore, the relative $V_t$ of the cells after an erase operation, relative to their location to array ground, will be different. The cells furthest from array ground will have higher $V_t$ levels than the cells closer to array ground.

For the reasons stated above, and for other reasons stated below which will become apparent to those skilled in the art upon reading and understanding the present specification, there is a need in the art for alternative flash memories with improved erase verification levels.

DETAILED DESCRIPTION

Figure 1:
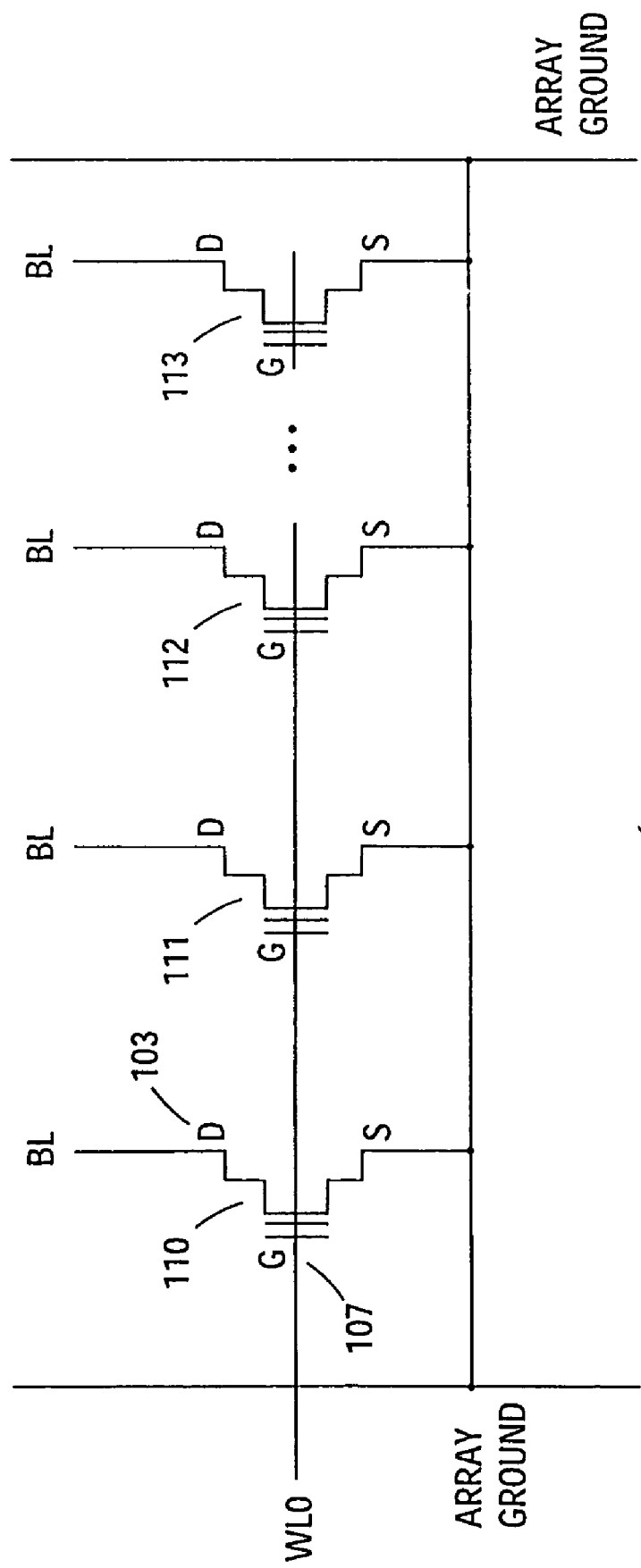
FIG. 1 shows a diagram of a row of memory cells in a typical prior art synchronous flash memory.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 2:
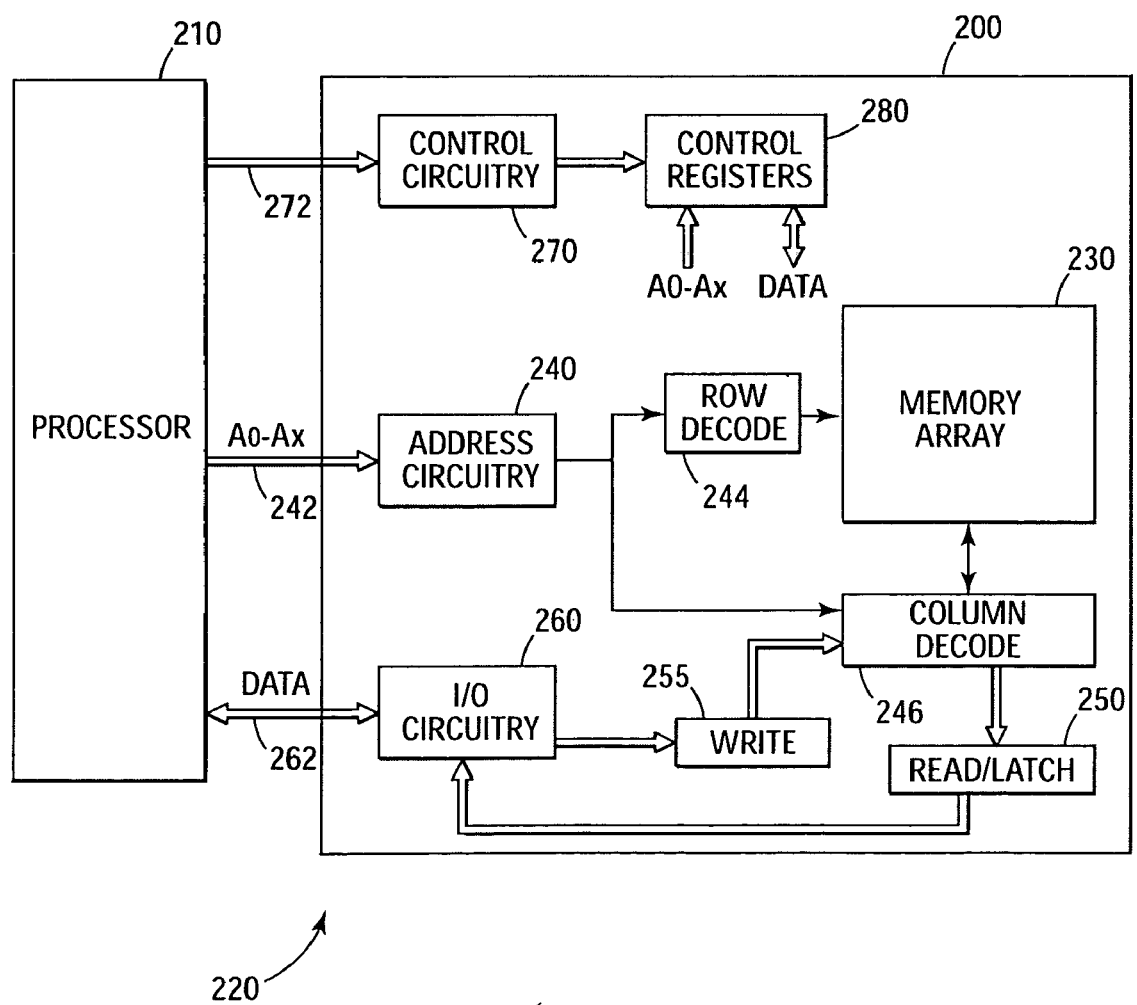
FIG. 2 shows a block diagram of one embodiment of an electronic system incorporating a flash memory of the present invention.

FIG. 2 is a functional block diagram of one embodiment of a memory device 200 of the present invention. The memory device 200 may be coupled to a processor 210 to form part of an electronic system 220. The memory device 200 has been simplified to focus on features of the memory that are helpful in understanding the present invention. In one embodiment, the memory device is a synchronous flash memory device.

The memory device includes an array of memory cells 230. The memory cells are non-volatile floating-gate memory cells and the memory array 230 is arranged in banks of rows and columns. In one embodiment, the array of memory cells is comprised of a block of memory that makes up a predetermined address range in the memory array.

An address buffer circuit 240 is provided to latch address signals provided on address input connections A0-Ax 242. Address signals are received and decoded by a row decoder 244 and a column decoder 246 to access the memory array 230. It will be appreciated by those skilled in the art, with the benefit of the present description, that the number of address input connections depends on the density and architecture of the memory array 230. That is, the number of addresses increases with both increased memory cell counts and increased bank and block counts.

The memory device 200 reads data in the memory array 230 using sense amplifiers to sense voltage or current changes in the memory array columns using read/latch circuitry 250. The read/latch circuitry 250, in one embodiment, is coupled to read and latch a row of data from the memory array 230. Data input and output buffer circuitry 260 is included for bi-directional data communication over a plurality of data (DQ) connections 262 with the processor 210. Write circuitry 255 is provided to write data to the memory array.

The control circuitry 270 decodes signals provided on control connections 272 from the processor 210). These signals are used to control the operations on the memory array 230, including data read, data write, and erase operations. In one embodiment, the control circuitry 270 is comprised of a state machine that executes the control functions of the memory device 200. An array of control registers 280 stores the commands and the control data.

The flash memory device illustrated in FIG. 2 has been simplified to facilitate a basic understanding of the features of the memory as they relate to the present invention. A more detailed understanding of internal circuitry and functions of flash memories and synchronous flash memories are known to those skilled in the art.

In one embodiment, the flash memory device of the present invention is a synchronous flash memory. The present invention is not limited to any one type of memory device. For example, the present invention encompasses NAND, NOR and other types of flash memory devices. Alternate embodiments include other forms of memory devices besides flash memory.

Figure 3:
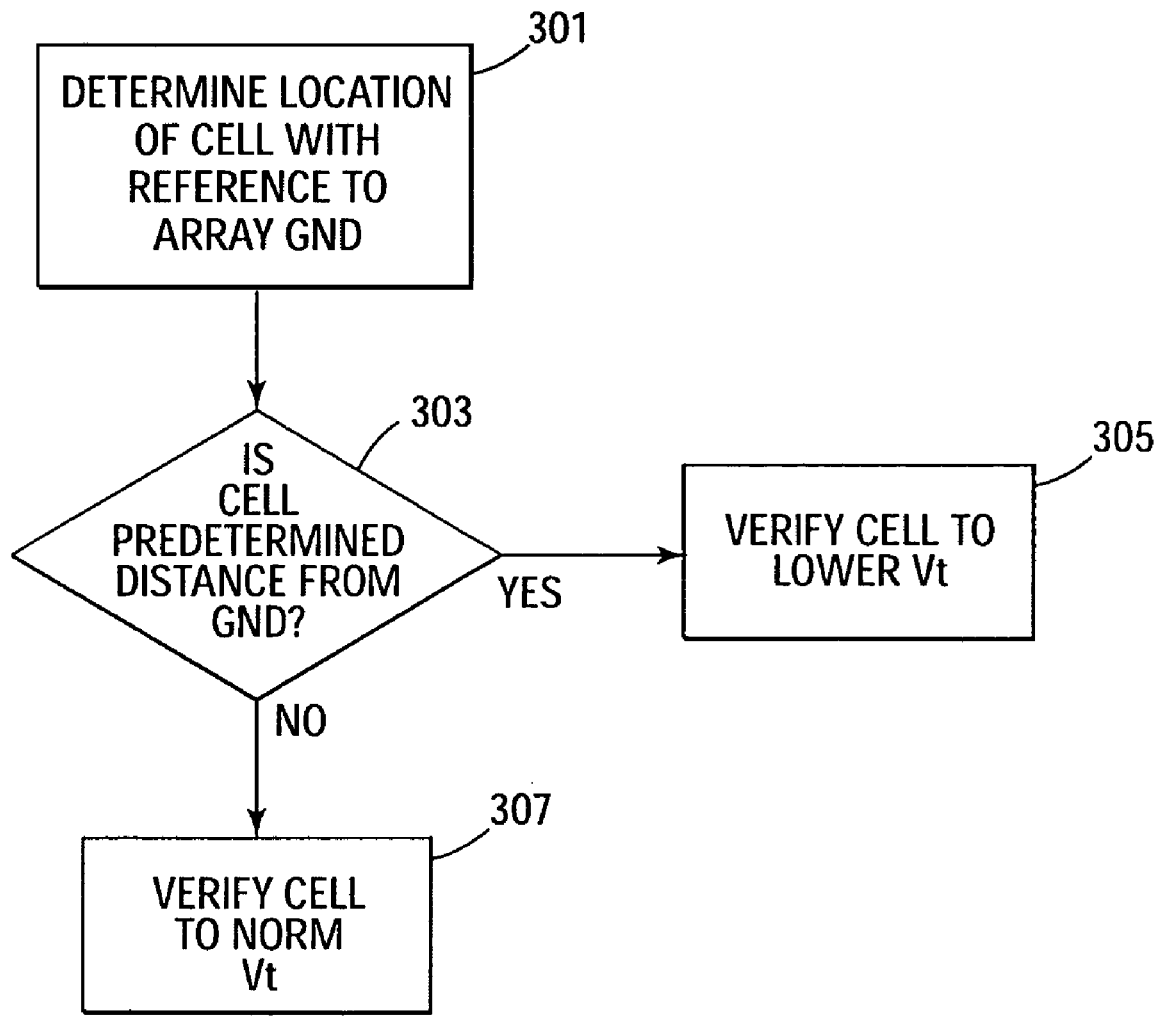
FIG. 3 shows a flow chart of one embodiment of an erase verification method of the present invention.

FIG. 3 illustrates a flow chart of one embodiment for an erase verification method of the present invention. The location of the cell to be verified is determined 301. The location is determined with reference to the memory array ground.

In one embodiment, the location is determined by decoding the address to the memory array for that particular cell. The flash memory controller circuitry maintains a table of cell addresses and their locations relative to array ground. In such an embodiment, the table might be stored in a separate non-volatile memory area specified for control functions.

In an alternate embodiment, the cell's location relative to array ground is determined at the time of programming. For example, when the cell is programmed, the controller circuitry determines that the desired cell is a certain number of cells from array ground (e.g., 8 cells from array ground). This information is then stored in non-volatile memory.

Alternate embodiments store the information in other locations or use other methods to determine the cell's location relative to array ground. The present invention is not limited to any one method for determining a cell's location.

If the cell is less than a predetermined distance (i.e., number of cells) from array ground 303, it is verified with a normal $V_t$. One such $V_t$ is 3.0V. Alternate embodiments use other thresholds. The present invention is not limited to any one threshold. The erase verification operation is well known in the art and is not discussed further.

If the cell is greater than or equal to a predetermined distance from array ground 303, it is verified to a lower threshold (e.g., 2.6V). In one embodiment, the predetermined distance from array ground is eight cells on one side and seven cells on the other side (i.e., assuming 16 cells between array grounds). This would place the desired cell in the middle of the row between array grounds with the greatest amount of total resistance on either side. Alternate embodiments use other thresholds for determining when to verify the cell to a lower threshold voltage.

The result of verifying a cell to a lower threshold voltage is that the cell will be erased harder than the surrounding cells. Thus, the middle cell that is the furthest from array ground will be erased harder than a neighboring cell in order to compensate for the high rise in source voltage during the read operation.

Figure 4:
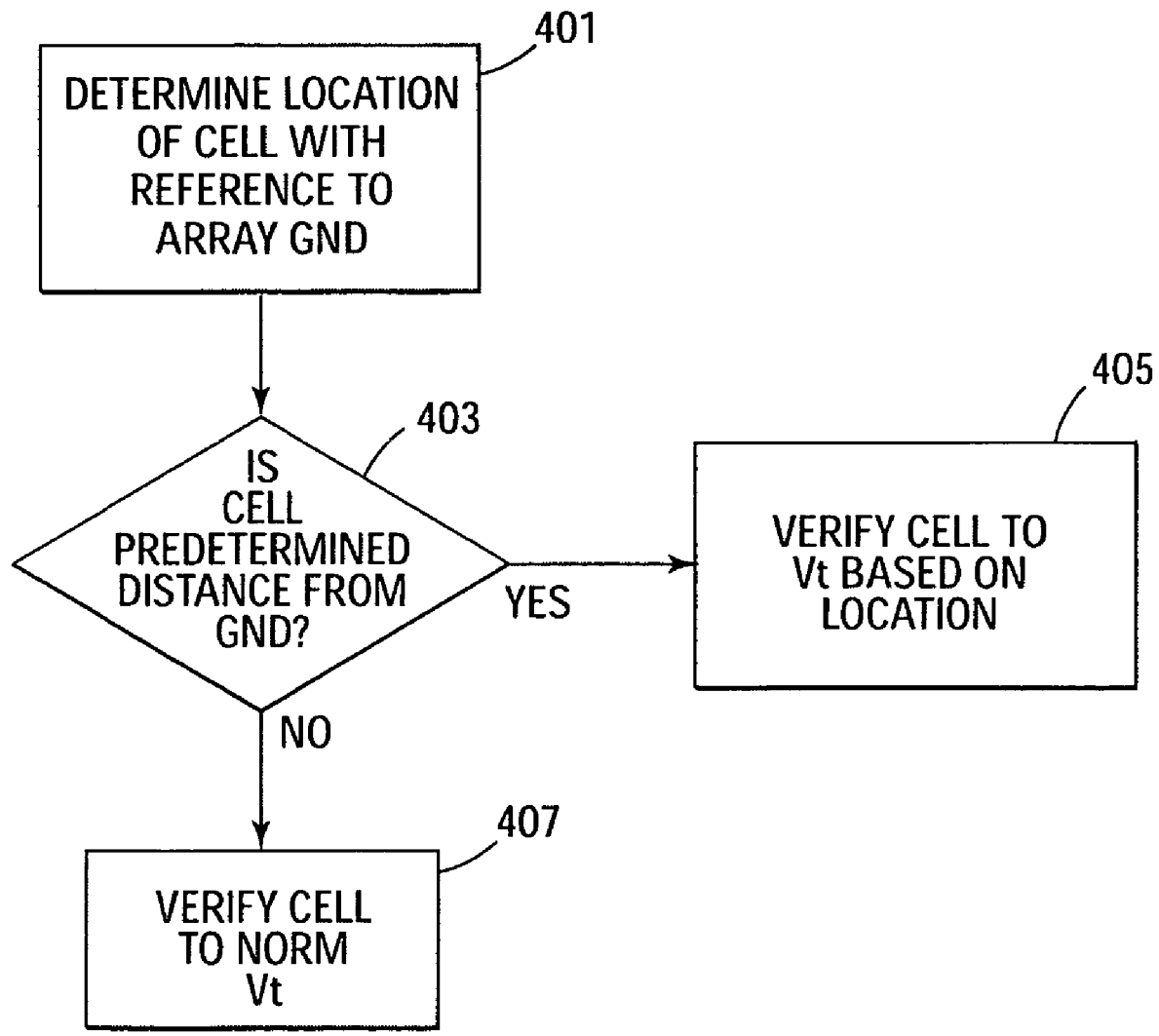
FIG. 4 shows a flow chart of an alternate embodiment of the erase verification method of the present invention.

FIG. 4 illustrates a flow chart of an alternate embodiment for an erase verification method of the present invention. This embodiment is similar to the embodiment of FIG. 3 except for the distribution of verification thresholds.

The location of the cell to be verified is determined relative to array ground 401. The methods of determining this have been discussed previously.

Once the distance of the cell from array ground is known, it is compared to a desired threshold 403. In one embodiment, this threshold is eight cells. If the desired cell is closer than the predetermined number of cells from ground, the cell is verified using a normal $V_t$ (e.g., 3.0V). This voltage depends on the embodiment. The present invention is not limited to any one threshold voltage.

If the distance of the cell from array ground is greater than or equal to the distance threshold 403, the cell is verified at a threshold voltage that varies as the distance from ground increases 405. For example, if the threshold is three cells and the cell to be verified is four cells from array ground, it is verified to a first $V_t$ (e.g., 2.7V). The next cell away from array ground would be verified to a somewhat smaller threshold voltage (e.g., 2.6V). This compensates for the different source voltages seen as a result of the varying resistance totals depending on the cell's location in the row.

CONCLUSION

The flash memory device of the present invention changes the verification threshold voltage in response to the cell's location with respect to array ground. A cell in the middle of a row of cells is verified to a lower voltage than the surrounding cells. This increases the number of erase pulses to that cell in order to erase it harder.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A non-volatile memory device comprising:
    a memory array comprising a plurality of memory cells arranged in memory blocks having rows and columns, each column coupled between a bit line and a source line and each row coupled to a word line, each source line coupled to memory array ground; and
    memory control circuitry coupled to the memory array for controlling operation of the memory device the control circuit adapted to execute a memory control method for erasing a first memory block, the method comprising erasing each memory cell, determining a position of each memory cell in the first memory block with respect to the memory array ground, and verifying erasure of each memory cell to a threshold voltage that varies in response to the position of each memory cell.

2. The device of claim 1 wherein the threshold voltage increases as the position with respect to memory array ground decreases.

3. The device of claim 1 wherein the non-volatile memory device is a synchronous flash memory device.

4. The device of claim 3 wherein the synchronous flash memory device is a NAND synchronous flash memory device.

5. The device of claim 3 wherein the synchronous flash memory device is a NOR synchronous flash memory device.

6. The device of claim 1 wherein the memory control circuitry is further adapted to erase each memory cell until the threshold voltage for each position is reached.

7. The device of claim 1 wherein the memory control circuitry is further adapted to determine the position of each cell during a programming operation of the memory block.

8. The device of claim 1 wherein the memory control circuitry is further adapted to determine the position of each cell by decoding an input address for each cell.

9. A non-volatile memory device comprising:
a memory array comprising a plurality of memory cells arranged in memory blocks having rows and columns, each column coupled between a bit line and a source line and each row coupled to a word line, each source line coupled to memory array ground; and
memory control circuitry coupled to the memory array for controlling operation of the memory device the control circuit adapted to execute a memory control method for erasing a first memory block, the method comprising determining a position of each memory cell in the first memory block relative to memory array ground, verifying erasure of each memory cell in the first memory block using a first threshold voltage that is adjusted in response to the position, and transmitting erase pulses to each memory cell in the memory block until the first threshold voltage is reached.

10. The device of claim 9 wherein the memory control circuitry is further adapted to store a table of positions from array ground of each memory cell in the first memory block.

11. The device of claim 9 wherein the position is a quantity of memory cells from array ground.

12. The device of claim 10 wherein the memory control circuitry is further adapted to access a memory location to retrieve the position in response to an input address.

13. A non-volatile memory device comprising:
a memory array comprising a plurality of memory cells arranged in memory blocks having rows and columns, each column coupled between a bit line and a source line and each row coupled to a word line, each source line coupled to memory array ground; and
memory control circuitry coupled to the memory array for controlling operation of the memory device the control circuit adapted to execute a memory control method for erasing a first memory block, the method comprising determining a quantity of cells that are between each cell in the memory block and memory array ground, erasing the memory block, and verifying erasure of each cell in the memory block to a first threshold voltage that is based on the quantity of cells.

14. The device of claim 13 wherein the first threshold voltage is less than a second threshold voltage of a second cell that is closer to the array ground than a first cell.

15. A synchronous flash memory device comprising:
a memory array comprising a plurality of memory cells arranged in memory blocks having rows and columns, each column coupled between a bit line and a source line and each row coupled to a word line, each source line coupled to memory array ground; and
memory control circuitry coupled to the memory array for controlling operation of the memory device the control circuit adapted to execute a memory control method for erasing a first memory block, the method comprising determining a distance in quantity of cells between each first cell in a first row of memory cells of the memory block and the memory array ground, erasing, and verifying erasure of each cell using a first threshold voltage that is determined in response to each distance.

16. The device of claim 15 and further including a memory that stores the distance of each cell in response to a memory address.

17. A non-volatile memory device comprising:
a memory array comprising a plurality of memory cells arranged in memory blocks having rows and columns, each column coupled between a bit line and a source line and each row coupled to a word line, each source line coupled to memory array ground; and
memory control circuitry coupled to the memory array for controlling operation of the memory device the control circuit adapted to execute a memory control method for erase verification of a first memory block, the method comprising determining a quantity of memory cells between each memory cell of the block and memory array ground, if a first cell is a predetermined quantity of memory cells from array ground, verifying erasure of the first cell using a first threshold voltage that decreases as the quantity of memory cells increases, and if the first cell is less than the predetermined quantity of memory cells from array ground, verifying the erasure of the first cell using a second threshold voltage that is greater than the first threshold voltage.

18. The device of claim 17 wherein the memory array is comprised of one of: a NAND flash architecture or a NOR flash architecture.

19. The device of claim 17 wherein the non-volatile memory device is a synchronous flash memory device.

* * * * *